(12) United States Patent
Haba et al.

(10) Patent No.: US 9,093,291 B2
(45) Date of Patent: *Jul. 28, 2015

(54) FLIP-CHIP, FACE-UP AND FACE-DOWN WIREBOND COMBINATION PACKAGE

(71) Applicant: Tessera, Inc., San Jose, CA (US)

(72) Inventors: Belgacem Haba, Saratoga, CA (US); Richard Dewitt Crisp, Hornitos, CA (US); Wael Zohni, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/058,908

(22) Filed: Oct. 21, 2013

(65) Prior Publication Data

US 2014/0042644 A1 Feb. 13, 2014

Related U.S. Application Data

(63) Continuation of application No. PCT/US2012/029873, filed on Mar. 21, 2012, which is a continuation of application No. 13/306,182, filed on Nov. 29, 2011, now Pat. No. 8,304,881.

(60) Provisional application No. 61/477,883, filed on Apr. 21, 2011.

(51) Int. Cl.
*H01L 23/48* (2006.01)
*H01L 25/07* (2006.01)
(Continued)

(52) U.S. Cl.
CPC .......... *H01L 25/071* (2013.01); *H01L 23/3128* (2013.01); *H01L 25/03* (2013.01);
(Continued)

(58) Field of Classification Search
CPC . H01L 25/0652; H01L 25/0657; H01L 25/50; H01L 25/03; H01L 25/105; H01L 25/071; H01L 23/3128
USPC ............................ 257/686, 698, 777, E23.011
See application file for complete search history.

(56) References Cited

U.S. PATENT DOCUMENTS

| 4,941,033 | A | 7/1990 | Kishida |
| 5,148,265 | A | 9/1992 | Khandros et al. |

(Continued)

FOREIGN PATENT DOCUMENTS

| CN | 101055840 A | 10/2007 |
| JP | 62107391 | 5/1987 |

(Continued)

OTHER PUBLICATIONS

Asinash Roy et al: "Effects of Coupling Capacitance and Inductance on Delay Uncertainty and Clock Skew" , 2007 44TH ACM/IEEE Design Automation Conference , San Diego, CA, Jun. 4-8, 2007, IEEE, PI Scataway, NJ , Jun. 1, 2007 (Jun. 1, 2007), pp. 184-1 87, XP031183328.

(Continued)

*Primary Examiner* — Trung Q Dang
(74) *Attorney, Agent, or Firm* — Lerner, David, Littenberg, Krumholz & Mentlik, LLP

(57) ABSTRACT

A microelectronic assembly can include a substrate having an aperture extending between first and second surfaces thereof, the substrate having substrate contacts at the first surface and terminals at the second surface. The microelectronic assembly can include a first microelectronic element having a front surface facing the first surface, a second microelectronic element having a front surface facing the first microelectronic element, and leads electrically connecting the contacts of the second microelectronic element with the terminals. The second microelectronic element can have contacts exposed at the front surface thereof beyond an edge of the first microelectronic element. The first microelectronic element can be configured to regenerate at least some signals received by the microelectronic assembly at the terminals and to transmit said signals to the second microelectronic element. The second microelectronic element can embody a greater number of active devices to provide memory storage array function than any other function.

19 Claims, 7 Drawing Sheets

(51) Int. Cl.
*H01L 23/31* (2006.01)
*H01L 25/065* (2006.01)
*H01L 25/00* (2006.01)
*H01L 25/03* (2006.01)
*H01L 25/10* (2006.01)

(52) U.S. Cl.
CPC ........ *H01L25/0652* (2013.01); *H01L 25/0657* (2013.01); *H01L 25/105* (2013.01); *H01L 25/50* (2013.01); *H01L 2224/06135* (2013.01); *H01L 2224/06136* (2013.01); *H01L 2224/16225* (2013.01); *H01L 2224/16227* (2013.01); *H01L 2224/16245* (2013.01); *H01L 2224/32145* (2013.01); *H01L 2224/32225* (2013.01); *H01L 2224/4824* (2013.01); *H01L 2224/4826* (2013.01); *H01L 2224/48227* (2013.01); *H01L 2224/48247* (2013.01); *H01L 2224/73204* (2013.01); *H01L 2224/73215* (2013.01); *H01L 2224/73253* (2013.01); *H01L 2224/73265* (2013.01); *H01L 2225/06558* (2013.01); *H01L 2225/06562* (2013.01); *H01L 2924/01087* (2013.01); *H01L 2924/09701* (2013.01); *H01L 2924/1461* (2013.01); *H01L 2924/15311* (2013.01); *H01L 2924/3011* (2013.01)

(56) References Cited

U.S. PATENT DOCUMENTS

| | | |
|---|---|---|
| 5,148,266 A | 9/1992 | Khandros et al. |
| 5,347,159 A | 9/1994 | Khandros et al. |
| 5,480,840 A | 1/1996 | Barnes et al. |
| 5,679,977 A | 10/1997 | Khandros et al. |
| 5,861,666 A | 1/1999 | Bellaar |
| 5,977,640 A | 11/1999 | Bertin et al. |
| 5,998,864 A | 12/1999 | Khandros et al. |
| 6,021,048 A | 2/2000 | Smith |
| 6,150,724 A | 11/2000 | Wenzel et al. |
| 6,199,743 B1 | 3/2001 | Bettinger et al. |
| 6,218,728 B1 | 4/2001 | Kimura |
| 6,218,731 B1 | 4/2001 | Huang et al. |
| 6,353,539 B1 | 3/2002 | Horine et al. |
| 6,369,448 B1 | 4/2002 | McCormick |
| 6,385,049 B1 | 5/2002 | Chia-Yu et al. |
| 6,392,292 B1 | 5/2002 | Morishita |
| 6,414,396 B1 | 7/2002 | Shim et al. |
| 6,445,594 B1 | 9/2002 | Nakagawa et al. |
| 6,472,741 B1 | 10/2002 | Chen et al. |
| 6,492,726 B1 | 12/2002 | Quek et al. |
| 6,583,502 B2 | 6/2003 | Lee et al. |
| 6,703,713 B1 | 3/2004 | Tseng et al. |
| 6,720,666 B2 | 4/2004 | Lim et al. |
| 6,731,009 B1 | 5/2004 | Jones et al. |
| 6,734,542 B2 | 5/2004 | Nakatani et al. |
| 6,742,098 B1 | 5/2004 | Halbert et al. |
| 6,762,942 B1 | 7/2004 | Smith |
| 6,793,116 B2 | 9/2004 | Harada |
| 6,811,580 B1 | 11/2004 | Littecke |
| 6,818,474 B2 | 11/2004 | Kim et al. |
| 6,977,440 B2 | 12/2005 | Pflughaupt et al. |
| 7,061,105 B2 | 6/2006 | Masuda et al. |
| 7,061,121 B2 | 6/2006 | Haba |
| 7,095,104 B2 | 8/2006 | Blackshear |
| 7,205,656 B2 | 4/2007 | Kim et al. |
| 7,389,937 B2 | 6/2008 | Ito |
| 7,462,936 B2 | 12/2008 | Haba et al. |
| 7,504,284 B2 | 3/2009 | Ye et al. |
| 7,633,146 B2 | 12/2009 | Masuda et al. |
| 7,638,868 B2 | 12/2009 | Haba |
| 7,855,462 B2 | 12/2010 | Boon et al. |
| 7,880,310 B2 | 2/2011 | Mathew |
| 7,892,889 B2 | 2/2011 | Howard et al. |
| 7,969,006 B2 | 6/2011 | Lin et al. |
| 8,026,589 B1 | 9/2011 | Kim et al. |
| 8,254,155 B1 | 8/2012 | Crisp et al. |
| 8,304,881 B1 * | 11/2012 | Haba et al. ............ 257/686 |
| 8,378,478 B2 | 2/2013 | Desai et al. |
| 2001/0005311 A1 | 6/2001 | Duesman et al. |
| 2002/0030267 A1 | 3/2002 | Suzuki |
| 2002/0053727 A1 | 5/2002 | Kimura |
| 2002/0175421 A1 | 11/2002 | Kimura |
| 2003/0064547 A1 | 4/2003 | Akram et al. |
| 2003/0116349 A1 | 6/2003 | Hashimoto |
| 2003/0179549 A1 | 9/2003 | Zhong et al. |
| 2003/0183917 A1 | 10/2003 | Tsai et al. |
| 2003/0193788 A1 | 10/2003 | Farnworth et al. |
| 2004/0016999 A1 | 1/2004 | Misumi |
| 2004/0124520 A1 | 7/2004 | Rinne |
| 2004/0184240 A1 | 9/2004 | Su |
| 2004/0262774 A1 | 12/2004 | Kang et al. |
| 2005/0110125 A1 | 5/2005 | Blackshear |
| 2005/0110162 A1 | 5/2005 | Meyer-Berg et al. |
| 2005/0116326 A1 | 6/2005 | Haba et al. |
| 2005/0116358 A1 | 6/2005 | Haba |
| 2005/0133932 A1 | 6/2005 | Pohl et al. |
| 2005/0164486 A1 | 7/2005 | Lua et al. |
| 2005/0173807 A1 | 8/2005 | Zhu et al. |
| 2005/0218514 A1 | 10/2005 | Massingill |
| 2005/0258538 A1 | 11/2005 | Gerber |
| 2006/0006405 A1 | 1/2006 | Mazzochette |
| 2006/0027902 A1 | 2/2006 | Ararao et al. |
| 2006/0081583 A1 | 4/2006 | Hembree et al. |
| 2006/0097379 A1 | 5/2006 | Wang |
| 2006/0097400 A1 | 5/2006 | Cruz et al. |
| 2006/0113653 A1 | 6/2006 | Xiaoqi et al. |
| 2006/0145323 A1 | 7/2006 | Lee |
| 2006/0231938 A1 | 10/2006 | Mangrum |
| 2006/0249827 A1 | 11/2006 | Fasano et al. |
| 2006/0290005 A1 | 12/2006 | Thomas et al. |
| 2007/0075409 A1 | 4/2007 | Letterman et al. |
| 2007/0108592 A1 | 5/2007 | Lai et al. |
| 2007/0120238 A1 | 5/2007 | Vaiyapuri |
| 2007/0152310 A1 | 7/2007 | Osborn et al. |
| 2007/0160817 A1 | 7/2007 | Roh |
| 2007/0164407 A1 | 7/2007 | Jun et al. |
| 2007/0176297 A1 | 8/2007 | Zohni |
| 2007/0176298 A1 | 8/2007 | Osone et al. |
| 2007/0181989 A1 | 8/2007 | Corisis et al. |
| 2007/0218689 A1 | 9/2007 | Ha et al. |
| 2007/0235886 A1 | 10/2007 | Yilmaz et al. |
| 2007/0257376 A1 | 11/2007 | Shimokawa et al. |
| 2008/0001241 A1 | 1/2008 | Tuckerman et al. |
| 2008/0001309 A1 | 1/2008 | Tago |
| 2008/0023805 A1 | 1/2008 | Howard et al. |
| 2008/0036067 A1 | 2/2008 | Lin |
| 2008/0042249 A1 | 2/2008 | Haba |
| 2008/0048777 A1 | 2/2008 | Kohjiro et al. |
| 2008/0073777 A1 | 3/2008 | Cui et al. |
| 2008/0093725 A1 | 4/2008 | Jung et al. |
| 2008/0122067 A1 | 5/2008 | Wang |
| 2008/0136006 A1 | 6/2008 | Jang et al. |
| 2008/0246130 A1 | 10/2008 | Carney et al. |
| 2008/0296717 A1 | 12/2008 | Beroz et al. |
| 2008/0303153 A1 | 12/2008 | Oi et al. |
| 2008/0315377 A1 | 12/2008 | Eichelberger et al. |
| 2009/0017583 A1 | 1/2009 | Jun et al. |
| 2009/0045524 A1 | 2/2009 | Mohammed et al. |
| 2009/0051043 A1 | 2/2009 | Wong et al. |
| 2009/0057864 A1 | 3/2009 | Choi et al. |
| 2009/0068858 A1 | 3/2009 | Di Stefano |
| 2009/0079061 A1 | 3/2009 | Mallik et al. |
| 2009/0104734 A1 | 4/2009 | Specht et al. |
| 2009/0108422 A1 | 4/2009 | Sasaki et al. |
| 2009/0168366 A1 | 7/2009 | Clayton et al. |
| 2009/0179321 A1 | 7/2009 | Sakamoto et al. |
| 2009/0185317 A1 | 7/2009 | Dijkhuis et al. |
| 2009/0200652 A1 | 8/2009 | Oh et al. |
| 2009/0200680 A1 | 8/2009 | Shinohara et al. |
| 2009/0236700 A1 | 9/2009 | Moriya |
| 2009/0243064 A1 | 10/2009 | Camacho et al. |
| 2009/0256266 A1 | 10/2009 | Lao et al. |
| 2009/0267222 A1 | 10/2009 | Zhong et al. |
| 2010/0019377 A1 | 1/2010 | Arvelo et al. |

(56) References Cited

U.S. PATENT DOCUMENTS

| | | | |
|---|---|---|---|
| 2010/0065955 A1 | 3/2010 | Chye et al. |
| 2010/0072602 A1 | 3/2010 | Sutardja |
| 2010/0090326 A1 | 4/2010 | Baek et al. |
| 2010/0127362 A1 | 5/2010 | Fan et al. |
| 2010/0133665 A1 | 6/2010 | Ha et al. |
| 2010/0193930 A1 | 8/2010 | Lee |
| 2010/0244278 A1 | 9/2010 | Shen |
| 2010/0258928 A1 | 10/2010 | Chi et al. |
| 2010/0295166 A1 | 11/2010 | Kim |
| 2010/0314740 A1 | 12/2010 | Choi et al. |
| 2010/0321885 A1 | 12/2010 | Huang |
| 2010/0327419 A1 | 12/2010 | Muthukumar et al. |
| 2011/0079905 A1 | 4/2011 | Sanchez et al. |
| 2011/0085304 A1 | 4/2011 | Bindrup et al. |
| 2011/0193582 A1 | 8/2011 | Cho |
| 2012/0091574 A1 | 4/2012 | Lin et al. |
| 2012/0092832 A1 | 4/2012 | Haba et al. |
| 2012/0126389 A1 | 5/2012 | Desai et al. |
| 2012/0153435 A1 | 6/2012 | Haba et al. |
| 2012/0267796 A1 | 10/2012 | Haba et al. |
| 2012/0267798 A1 | 10/2012 | Haba et al. |
| 2013/0082394 A1 | 4/2013 | Crisp et al. |
| 2013/0099387 A1 | 4/2013 | Caskey et al. |
| 2013/0168843 A1 | 7/2013 | Zohni |
| 2013/0249116 A1 | 9/2013 | Mohammed et al. |
| 2014/0035121 A1 | 2/2014 | Haba et al. |

FOREIGN PATENT DOCUMENTS

| | | |
|---|---|---|
| JP | 2001196407 A | 7/2001 |
| JP | 2001223324 A | 8/2001 |
| JP | 2002-076252 A | 3/2002 |
| JP | 2003-101207 | 4/2003 |
| JP | 2004-063767 A | 2/2004 |
| JP | 2005251957 A | 9/2005 |
| JP | 2006079629 A | 3/2006 |
| JP | 2006-210892 | 8/2006 |
| JP | 2008177241 A | 7/2008 |
| JP | 2008-198841 A | 8/2008 |
| JP | 2008-235576 | 10/2008 |
| JP | 2010-098098 A | 4/2010 |
| KR | 2001-0002214 A | 1/2001 |
| KR | 2001-0081922 A | 8/2001 |
| KR | 20010081922 A | 8/2001 |
| KR | 2001-0094894 A | 11/2001 |
| KR | 10-0382035 | 4/2003 |
| KR | 10-0393095 | 7/2003 |
| KR | 2005-0119414 A | 12/2005 |
| KR | 2006-0120365 A | 11/2006 |
| KR | 10-0690247 B1 | 2/2007 |
| KR | 1020060004298 | 3/2007 |
| KR | 2007-0088177 A | 8/2007 |
| KR | 2009-0008341 A | 1/2009 |
| KR | 2009-0086314 A | 8/2009 |
| KR | 2010-0041430 A | 4/2010 |
| KR | 101011863 B1 | 1/2011 |
| KR | 101061531 B1 | 9/2011 |
| TW | 1313049 B | 8/2009 |
| WO | 2007088757 A1 | 8/2007 |

OTHER PUBLICATIONS

International Search Report and Written Opinion for application No. PCT/US2012/029873 dated Jun. 4, 2012.
International Search Report and Written Opinion for Application No. PCT/US2012/029876 dated Aug. 17, 2012.
International Search Report and Written Opinion for Application No. PCT/US2012/032997 dated Aug. 7, 2012.
International Search Report and Written Opinion for Application No. PCT/US2013/053240 dated Sep. 16, 2013.
International Search Report and Written Opinion for PCT/US2012/034196 dated Jun. 4, 2012.
International Search Report Application No. PCT/US2011/031391, dated Dec. 12, 2011.
Korean Application No. 10-2011-0041843, dated May, 3, 2011 (English translation of Spec and drawings).
Korean Search Report from U.S. Appl. No. 61/477,820, dated Sep. 6, 2011.
Korean Search Report from U.S. Appl. No. 61/477,877, dated Sep. 6, 2011.
Korean Search Report from U.S. Appl. No. 61/477,883, dated Sep. 6, 2011.
Korean Search Report from U.S. Appl. No. 61/477,967, dated Sep. 6, 2011.
Office Action from Korean Patent Application No. 10-2010-0129888 dated Jan. 18, 2011.
Office Action from Korean Patent Application No. 10-2010-0129890 dated Jan. 18, 2011.
Partial International Search Report Application No. PCT/US2011/031391, dated Aug. 25, 2011.
Partial International Search Report for Application No. PCT/US2012/032997 dated Jun. 27, 2012.
Search Report from Korean Patent Application No. 10-2010-0129888 dated Jan. 18, 2011.
Search Report from Korean Patent Application No. 10-2010-0129890 dated Jan. 18, 2011.
Written Opinion of the International Preliminary Examining Authority dated Apr. 16, 2013 for Application No. PCT/US2012/029876.
International Search Report and Written Opinion for Application No. PCT/US2012/071630 dated Apr. 4, 2013.
International Search Report and Written Opinion for Application No. PCT/US2013/065605 dated Feb. 21, 2014.
International Search Report for Application No. PCT/US2011/056352 dated Apr. 5, 2012.
Partial Search Report for Application No. PCT/US2013/065605 dated Nov. 28, 2013.
Taiwanese Office Action for Application No. 101112514 dated Mar. 13, 2014.
U.S. Appl. No. 61/477,877 filed on Apr. 21, 2011.
European Examination Report for Application No. 11776969.5 dated Jun. 27, 2014.
International Preliminary Report on Patentability for Application No. PCT/US2011/056352 dated Apr. 23, 2013.
Second Written Opinion for Application No. PCt/US2013/053240 dated Jul. 29, 2014.
Taiwanese Office Action for Application No. 101112511 dated Sep. 30, 2014.

* cited by examiner

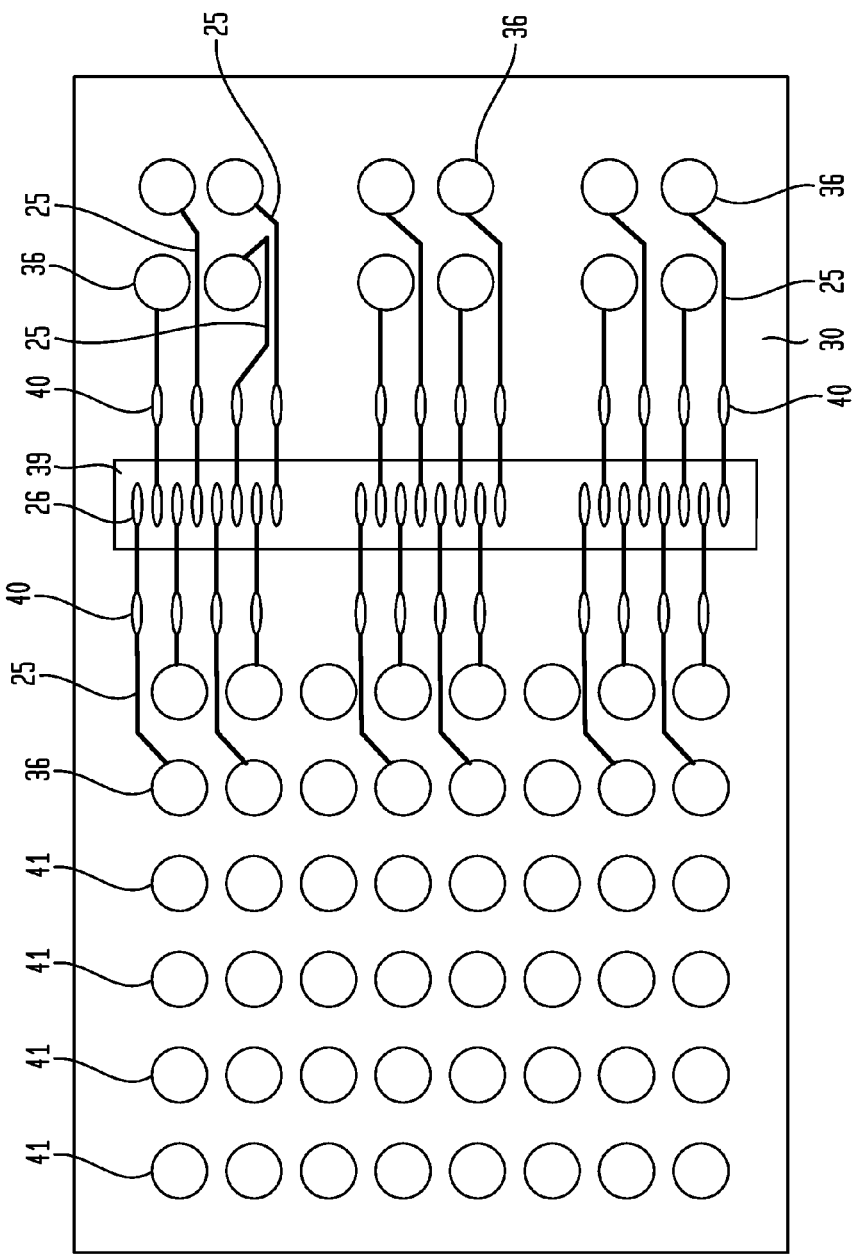

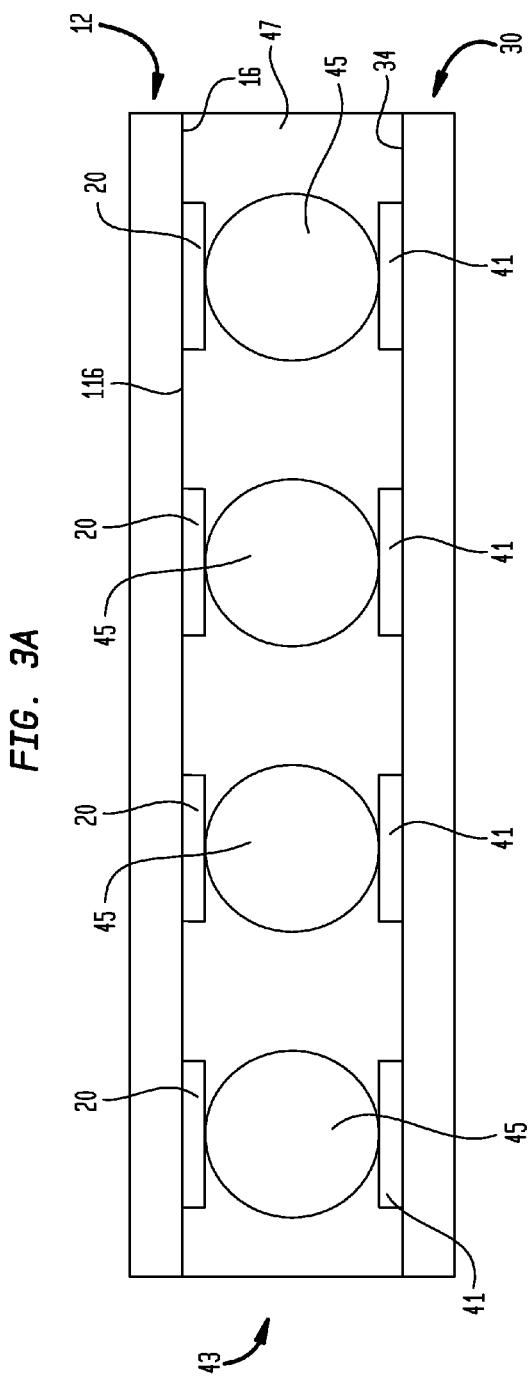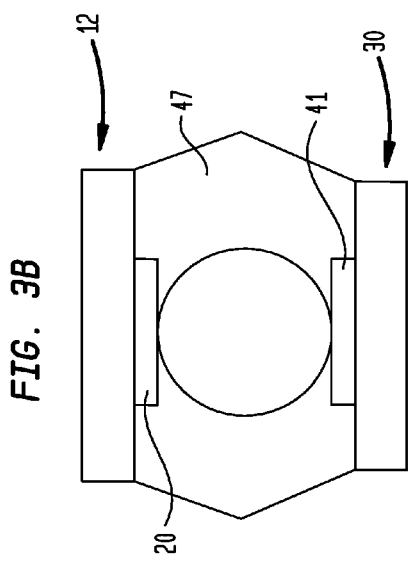

FLIP-CHIP, FACE-UP AND FACE-DOWN WIREBOND COMBINATION PACKAGE

CROSS-REFERENCE TO RELATED APPLICATIONS

The present application is a continuation of International Application No. PCT/US2012/029873 filed Mar. 21, 2012, which, in turn, is a continuation of U.S. patent application Ser. No. 13/306,182, filed Nov. 29, 2011, and which claims the benefit of the filing date of U.S. Provisional Patent Application No. 61/477,883, filed Apr. 21, 2011, all of which are hereby incorporated herein by reference. The following commonly-owned applications are hereby incorporated by reference herein: U.S. Provisional Patent Application Ser. Nos. 61/477,820, 61/477,877, and 61/477,967, all filed Apr. 21, 2011.

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel e ual to or slightly larger than the area of the chip's front face, such as disclosed, for example, in certain embodiments of commonly-assigned U.S. Pat. Nos. 5,148,265; 5,148,266; and 5,679,977, the entire disclosures of which are incorporated herein by reference.

Certain innovative mounting techni ues offer compactness approaching or e ual to that of conventional flip-chip bonding. Packages which can accommodate a single chip in an area of the circuit panel e ual to or slightly larger than the area of the chip itself are commonly referred to as "chip-sized packages."

Besides minimizing the planar area of the circuit panel occupied by microelectronic assembly, it is also desirable to produce a chip package that presents a low, overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel. Various proposals have been advanced for providing plural chips in a single package or module. In the conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148, 265; and U.S. Pat. No. 5,347,159, the entire disclosures of which are incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

BRIEF SUMMARY OF THE INVENTION

In accordance with an aspect of the invention, a microelectronic assembly can include a substrate having oppositely-facing first and second surfaces and at least one aperture extending between the first and second surfaces, the substrate having substrate contacts at the first surface and terminals at the second surface. The microelectronic assembly can also include a first microelectronic element having a front surface facing the first surface, a second microelectronic element having a front surface facing the first microelectronic element, and leads electrically connecting the contacts of the second microelectronic element with the terminals. The first microelectronic element can have a rear surface remote from the front surface and an edge extending between the front and rear surfaces. The first microelectronic element can have a plurality of contacts at the front surface that face and are joined to corresponding ones of the substrate contacts. The second microelectronic element can have a plurality of contacts exposed at the front surface thereof beyond the edge of the first microelectronic element. The second microelectronic element can embody a greater number of active devices to provide memory storage array function than any other function. The leads can have portions aligned with the at least one aperture. The first microelectronic element can be configured to regenerate at least some signals received by the microelectronic assembly at the terminals and to transmit said signals to the second microelectronic element.

In an exemplary embodiment, the first microelectronic element can be configured to control transfers of data between a component external to the microelectronic assembly and the second microelectronic element. In one embodiment, the first microelectronic element can be configured to provide buffering of signals between the external component and the second microelectronic element. In a particular embodiment, the first microelectronic element can be configured to predominantly perform a logic function.

In one embodiment, the assembly can also include a third microelectronic element at least partially overlying the second microelectronic element. The third microelectronic element can have a plurality of contacts exposed at the front surface thereof beyond an edge of the second microelectronic element and electrically connected to at least some of the substrate contacts. The assembly can also include second leads electrically connecting the contacts of the third microelectronic element with the terminals, the second leads having portions aligned with the at least one aperture. In one embodiment, the second and third microelectronic elements can each include nonvolatile flash memory. In a particular embodiment, the first microelectronic element can have a predominant function other than to provide a memory storage array. In a particular embodiment, the contacts of the second microelectronic element can be located adjacent the edge of the second microelectronic element, and the contacts of the third microelectronic element can be located adjacent an edge of the third microelectronic element.

In a particular embodiment, the contacts of the second microelectronic element can be disposed within a central region of the front surface thereof. The central region can be spaced apart from first and second opposed edges of the second microelectronic element. In one embodiment, the substrate can include a dielectric element having first and second surfaces defining the first and second substrate surfaces. Leads extending along at least one of the first or second surfaces of the dielectric element and beyond an edge of the at least one aperture can be bonded to the contacts of the second microelectronic element. In an exemplary embodiment, the substrate can have a coefficient of thermal expansion of less than 7 parts per million/° C. In a particular embodiment, the leads can include wire bonds extending through the at least one aperture to bonding contacts at the second surface of the substrate.

In one embodiment, the assembly can also include substantially rigid electrically conductive posts extending from at least one of the substrate or the first microelectronic element. In one embodiment, the assembly can also include a spacing element between the front surface of the second microelectronic element and the first surface of the substrate. In an exemplary embodiment, the assembly can also include a third microelectronic element having a front surface and a rear surface remote therefrom, the rear surface facing the rear surface of the first microelectronic element. The third microelectronic element can have a plurality of contacts exposed at the front surface thereof and a plurality leads electrically connecting the contacts of the third microelectronic element and at least some of the substrate contacts.

In an exemplary embodiment, the leads can connect the contacts of the third microelectronic element to at least some of the substrate contacts include wire bonds. In a particular embodiment, the leads connecting the contacts of the third microelectronic element to at least some of the substrate contacts can include lead bonds extending beyond an edge of the third microelectronic element. The edge of the third microelectronic element can extend between the front and rear surfaces of the third microelectronic element. In one embodiment, the assembly can also include a fourth microelectronic element having a front surface facing the dielectric element and a rear surface remote therefrom. The fourth microelectronic element can have a plurality of contacts exposed at the front surface thereof and electrically connected to at least some of the first electrically conductive elements. The second microelectronic element can at least partially overlie the fourth microelectronic element.

In a particular embodiment, the assembly can also include a third microelectronic element having a front surface facing the substrate and a rear surface remote therefrom. The third microelectronic element can have a plurality of contacts exposed at the front surface thereof and electrically connected to at least some of the substrate contacts. The second microelectronic element can at least partially overlie the third microelectronic element. In an exemplary embodiment, the third microelectronic element can include a chip configured to predominantly perform a logic function.

In accordance with another aspect of the invention, a microelectronic assembly can include a substrate having oppositely-facing first and second surfaces and a first aperture extending between the first and second surfaces, the substrate further having a plurality of electrically conductive elements thereon. The assembly can also include a first microelectronic element having a surface facing the first surface of the substrate, a second microelectronic element having a front surface facing the first microelectronic element, signal leads connected to the second microelectronic element and extending through the first aperture to at least some of the conductive elements on the substrate, and at least one power regulation component having active circuit elements therein disposed between the first surface of the substrate and the front surface of the second microelectronic element. The first microelectronic element can have another surface remote from the front surface, and an edge extending between the surfaces thereof. The second microelectronic element can have a plurality of contacts exposed at the front surface thereof. The second microelectronic element can project beyond the edge of the first microelectronic element.

In one example, the substrate can include a second aperture extending between the first and second surfaces. The microelectronic assembly can further include additional signal leads electrically connecting the first microelectronic element with the conductive elements on the substrate. The additional signal leads can have portions aligned with the second aperture. In a particular embodiment, the at least one power regulation component can include an on/off switch. Further aspects of the invention can provide systems that incorporate microelectronic assemblies according to the foregoing aspects of the invention in conjunction with other electronic components electrically connected thereto. For example, the system can be disposed in and/or mounted to a single housing, which can be a portable housing. Systems according to preferred embodiments in this aspect of the invention can be more compact than comparable conventional systems.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

FIG. 2 is a plan view of the microelectronic assembly shown in FIG. 1;

FIG. 3A is a sectional view illustrating a portion of the stacked microelectronic assembly shown in FIG. 1;

FIG. 3B is an exploded sectional view illustrating a portion of FIG. 3A;

DETAILED DESCRIPTION

Figure 1:
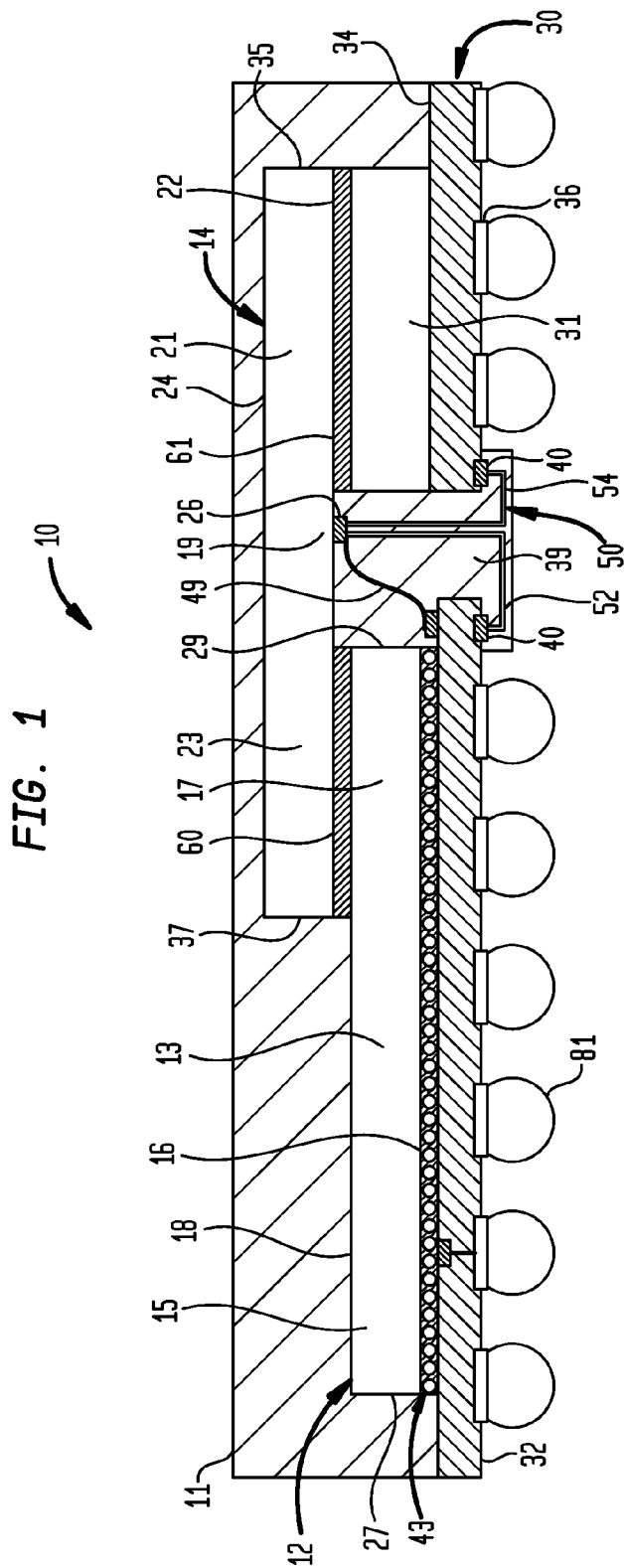
FIG. 1 is a diagrammatic sectional elevation view of a stacked microelectronic assembly in accordance with an embodiment of the present invention.

With reference to FIGS. 1 and 2, a stacked microelectronic assembly 10 according to an embodiment of the present invention includes a first microelectronic element 12 in a face down or flip-chip position and a second microelectronic element 14 in a face down position. In some embodiments, the first and second microelectronic elements 12 and 14 may be a semiconductor chip, or an element including a semiconductor chip, which has contacts at the front surface 16 thereof. The semiconductor chip may be a thin slab of a semiconductor material, such as silicon or gallium arsenide, and may be provided as individual, prepackaged units. The semiconductor chip may embody active circuit elements, e.g., transistors, diodes, among others, or passive circuit elements such as resistors, capacitors or inductors, among others, or a combination of active and passive circuit elements. In an "active" semiconductor chip, the active circuit elements in each microelectronic element typically are electrically connected together in one or more "integrated circuits". The first and second microelectronic elements may both be electrically connected to a substrate 30 as discussed in detail below. In turn, in one embodiment, the substrate 30 can be electrically connected to a circuit panel, such as a printed circuit board. In a particular embodiment, the microelectronic assembly 10 can be a microelectronic "package" having terminals which are configured for electrical connection with corresponding contacts on a face of a circuit panel, such as a printed circuit board, among others.

In particular embodiments, the substrate can be a dielectric element of various types of construction, such as of polymeric material or inorganic material such as ceramic or glass, the substrate having conductive elements thereon such as terminals and conductive elements such as e.g., traces, substrate contacts, or other conductive elements electrically connected with the terminals. In another example, the substrate can consist essentially of a semiconductor material such as silicon, or alternatively include a layer of semiconductor material and one or more dielectric layers thereof. Such substrate may have a coefficient of thermal expansion of less than 7 (seven) parts per million per degree Celsius ("ppm/° C."). In yet another embodiment, the substrate can be a lead frame having lead fingers, wherein the terminals can be portions of the lead fingers, such as end portions of the lead fingers.

The first microelectronic element 12 may include a semiconductor chip configured predominantly to perform a logic function, such as a microprocessor, application-specific integrated circuit ("ASIC"), field programmable gate array ("FPGA") or other logic chip, among others. In other examples, the first microelectronic element 12 can include or be a memory chip such as a flash (NOR or NAND) memory chip, dynamic random access memory ("DRAM") chip or static random access memory ("SRAM") chip, or be configured predominantly to perform some other function. In one example, the first microelectronic element 12 can embody a greater number of active devices to provide memory storage array function than any other function. The first microelectronic element 12 has a front surface 16, a rear surface 18 remote therefrom, and first and second edges 27, 29, extending between the front and rear surfaces.

In a particular embodiment, the first microelectronic element 12 can have a predominant function other than to provide a memory storage array. In one example, the first microelectronic element 12 can be configured to control transfers of data between a component external to the microelectronic assembly and the second microelectronic element. In an exemplary embodiment, the first microelectronic element 12 can be configured to provide buffering of signals between an external component and other microelectronic elements in the stacked microelectronic assembly 10, such as the second microelectronic element 14 or a plurality of second microelectronic elements (e.g., the second microelectronic elements 714 shown in FIG. 7). In one example, the first microelectronic element 12 can be configured to regenerate at least some signals received by the microelectronic assembly 10 at the terminals 36 and to transmit said signals to the second microelectronic element 14. Such a first microelectronic element 12 can be configured to help provide impedance isolation for the second microelectronic element 14 with respect to components external to the microelectronic assembly 10.

In another example, the microelectronic assembly 10 can be configured to function as a solid state memory drive. In such an example, the first microelectronic element 12 can include a semiconductor chip configured predominantly to perform a logic function, such as a solid state drive controller, and the second microelectronic element 14 can include memory storage elements such as nonvolatile flash memory. The first microelectronic element 12 can include a special purpose processor that is configured to relieve a central processing unit of a system such as the system 1100 (FIG. 8) from supervision of transfers of data to and from the memory storage elements included in the second microelectronic element 14. Such a first microelectronic element 12 including a solid state drive controller can provide direct memory access to and from a data bus on a motherboard (e.g., the circuit panel 1102 shown in FIG. 8) of a system such as the system 1100.

Electrical contacts 20 are exposed at the front surface 16 of the first microelectronic element 12. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure. Electrical contacts 20 may include bond pads or other conductive structure such as bumps, posts, etc. The bond pads may include one or more metals such as copper, nickel, gold or aluminum, and may be about 0.5 μm thick. The size of the bond pads can vary with the device type but will typically measure tens to hundreds of microns on a side.

The second microelectronic element 14 has a front surface 22, a rear surface 24 remote therefrom, and first and second edges 35, 37, extending between the front and rear surfaces and contacts 26 exposed at the front surface 22. As seen in FIG. 1, the first and second microelectronic elements 12 and 14 are stacked relative to each other such that at least a portion of the second microelectronic element 14 overlies at least a portion of the first microelectronic element 12 and contacts 26 of the second microelectronic element 14 are disposed beyond the second edge 29 of the first microelectronic element 12.

In a particular embodiment, such as shown in FIG. 1, the front surface 22 of the second microelectronic element 14 includes first and second end regions 21 and 23 and a central region 19 extending between the first and second end regions 21 and 23. The first end region 21 extends between the central region 19 and first edge 35, and the second end region 23 extends between the central region 19 and the second edge 37. The central region may extend a third of the distance between the first and second edges 35, 37 of the second microelectronic element 14 and the first and second end regions may each extend a third of the distance between the edges 35, 37. Electrical contacts 26 are exposed at the front surface 22 of the second microelectronic element 14. For example, contacts 26 may be arranged in one or two parallel rows adjacent the center of the front surface 22. In one embodiment, the contacts 26 of the second microelectronic element 14 can extend in a direction transverse to the direction the contacts 20 of the first microelectronic element 12 extend. The second microelectronic element 14 may include or be a DRAM chip. In one example, the second microelectronic element 14 can embody a greater number of active devices to provide memory storage array function than any other function. At least a portion of the central region 19 of the second microelectronic element 14 projects beyond the second edge 29 of the first microelectronic element 12 such that the contacts 26 of the second microelectronic element 14 are exposed beyond the second edge 29 of the first microelectronic element 12.

As discussed above, in one embodiment, the substrate 30 may include a dielectric element having oppositely-facing first and second surfaces 34 and 32. One or more electrically conductive elements or terminals 36 are exposed at the second surface 32 of the dielectric element 30. In a particular embodiment, some or all of the terminals 36 may be movable with respect to the first and/or second microelectronic element 12 and 14.

The substrate further includes one or more apertures extending between first and second opposed surfaces thereof such as, for example, between the oppositely facing first and second surfaces of a dielectric element 30. In the embodiment depicted in FIG. 1, the substrate includes an aperture 39 and at least some of the contacts 26 are aligned with the aperture 39 of the dielectric element. A plurality of leads electrically connects the contacts 26 of the second microelectronic element with the terminals 36 of the microelectronic assembly. The leads have portions aligned with the aperture 39. For example, the leads can include wire bonds 50 bonded to the substrate contacts which in turn connect to terminals 36 through other portions of the leads such as metal traces extending along a semiconductor element or dielectric element 30, or if the substrate includes a lead frame, the leads may include portions of the lead fingers thereof.

As seen in FIG. 1, the substrate 30 may extend beyond the first edge 27 of the first microelectronic element 12 and the second edge 35 of the second microelectronic element 14. In an example, a substrate which includes a dielectric material may be referred to as a "dielectric element" 30, whether made partly or entirely of any suitable dielectric material. The dielectric element 30 may be For example, the dielectric element 30 may comprise a layer of flexible material, such as a layer of polyimide, BT resin or other dielectric material of the commonly used for making tape automated bonding ("TAB") tapes. Alternatively, the dielectric element 30 may comprise a relatively rigid, board like material such as a thick layer of fiber-reinforced epoxy, such as, Fr-4 or Fr-5 board. Regardless of the material employed, the dielectric element 30 may include a single layer or multiple layers of dielectric material.

The first surface 34 of the dielectric element 30 may be juxtaposed with the front surface 16 of the first microelectronic element 12. As seen in FIGS. 1 and 2, the dielectric element 30 may also include electrically conductive elements 40 and electrically conductive traces 25 exposed on the second surface 32. The electrically conductive traces 25 electrically couple the electrically conductive elements 40 to the terminals 36. The traces and electrically conductive elements 40 may be created using the methods illustrated in commonly assigned U.S. Application Publication No. 2005/0181544, the entire disclosure of which is incorporated herein by reference. The dielectric element 30 may further include electrically conductive elements 48 exposed on the first surface 34.

Returning to FIG. 1, a spacing or support element 31 may be positioned between the first end region 21 of the second microelectronic element 14 and a portion of the dielectric element 30. The spacing element 31 may help support the second microelectronic element above the substrate 30. Such a spacing element 31 can be made, for example, from a dielectric material such as silicon dioxide or other material, a semiconductor material such as silicon, or one or more layers of adhesive or other polymeric material. In a particular embodiment, the spacing element can include or be made of metal. If the spacing element includes adhesives, the adhesives can connect the second microelectronic element 14 to the substrate 30. In one embodiment, the spacing element 31 can have substantially the same thickness in a vertical direction that is substantially perpendicular to the first surface 34 of the substrate as the thickness of the first microelectronic element between the front and rear surfaces 16, 18 thereof. As shown in FIG. 1, if spacing element 31 includes an adhesive, the adhesive can connect the second microelectronic element 14 to the dielectric element 30. As shown in FIG. 1, the second end region 23 of the second microelectronic element 14 can be bonded to the second end region 17 of the first microelectronic element 12 with a bond material 60 such as an adhesive 60, which may be thermally conductive. Likewise, an adhesive, optionally thermally conductive, may bond the first end region of the second microelectronic element with the spacing element 31. Similarly, spacing element 61 may include adhesives for bonding the second microelectronic element 14 and the spacing element 31. In a particular embodiment, the bond materials 60, 61 or both may be partly or entirely made of a die-attach adhesive, and in a particular example, may be comprised of a low elastic modulus material such as silicone elastomer. However, the bond materials 60, 61 or both may be entirely or partly made of high elastic modulus adhesive or solder if the microelectronic elements 12 and 14 are conventional semiconductors chips formed of the same material, because the microelectronic elements will tend to expand and contract in unison in response to temperature changes. Irrespective of the materials employed, each of spacing elements 31 and 60 may include a single layer or multiple layers.

Referring to FIG. 1, the microelectronic assembly may include bond wires 50 which electrically connect contacts 26 of the second microelectronic element 12 to the terminals 36 of the substrate. In one embodiment, the leads can include bond elements 50 such as wire bonds which extend through aperture 39 and are bonded to contacts 26, 40 of the microelectronic element and the substrate. The bond elements 50 are at least partially aligned with the aperture 39 of the dielectric element 30. The bond wires 50 may include multiple wire bonds 52, 54 electrically connecting some contacts of second microelectronic element 14 with conductive elements 40. Wire bonds 52, 54 extend through the aperture 39. Each of the wire bonds 52 and 54 electrically couples a contact 26 to a corresponding conductive element 40 of the dielectric element 30. The bond wires 50 may include a multiple wire bond structure as described in U.S. patent application Ser. No. 12/907,522 filed Oct. 19, 2010 and entitled "Enhanced Stacked Microelectronic Assemblies with Central Contacts and Improved Thermal Characteristics," the entire disclosure of which is incorporated herein by reference. As seen in FIG. 1, alternatively or additionally, leads such as lead bonds 49 may extend along the first surface 34 of the dielectric element 30 as shown or along the second surface and into the aperture 39 to electrically connect to contacts 26. The lead bonds 49 do not necessarily extend through the aperture 39 of the dielectric element 30 but are at least partially aligned with the aperture.

The microelectronic assembly 10 may further include an overmold or encapsulant 11 covering at least the first microelectronic element 12 and the second microelectronic element 14. As seen in FIG. 1, the overmold 11 may also cover portions of the dielectric element 30 extending beyond the first edge 27 of the first microelectronic element 12 and the first edge 35 of the second microelectronic element 14. Consequently, the overmold 11 may contact at least the first edge 27 of the first microelectronic element 12, the first edge 35 of the second microelectronic element 14, and the first surface 34 of the dielectric element 30. The overmold 11 may be made from any suitable material, including epoxy and the like.

The microelectronic assembly 10 may additionally include a heat spreader or heat sink attached to the rear surfaces of one or more of the first or second microelectronic elements 12 and 14, as described in U.S. patent application Ser. No. 12/907, 522 filed Oct. 19, 2010 and entitled "Enhanced Stacked Microelectronic Assemblies with Central Contacts and Improved Thermal Characteristics," the entire disclosure of which is hereby incorporated herein by reference. In some embodiments, the microelectronic assembly 10 includes a heat spreader thermally coupled to the first and/or second microelectronic elements 12 and 14 but does not include an overmold 11.

In addition, the microelectronic assembly 10 may further include joining units 81 attached to terminals 36 on the second surface 32 of the dielectric element 30. The joining units 81 may be solder balls or other masses of bond and metal, e.g., tin, indium, or a combination thereof, and are adapted to join and electrically couple the microelectronic assembly 10 to a circuit panel, such as a printed circuit board.

With reference to FIGS. 2 and 3A, the dielectric element 30 also includes electrically conductive elements 41, such as contact pads, and electrically conductive traces 25 on its first surface 34. The electrically conductive elements 41 may extend within the interior of the dielectric element 30. Thus, as used in this disclosure, a statement that a first feature is disposed "on" a second feature should not be understood as requiring that the first feature lie on a surface of the second feature.

With continued reference to FIG. 3A, a flip-chip interconnection 43 electrically connects electrical contacts 20 on the front surface 16 of the first microelectronic element 12 to the electrically conductive elements 41 on the first surface 34 of the dielectric element 30. In an exemplary embodiment, the plurality of electrical contacts 20 at the front surface 16 of the first microelectronic 12 can face and can be joined to corresponding ones of the electrically conductive elements 41 of the dielectric element 30. A flip-chip interconnection is a commonly used scheme for conductively connecting bond pads on the semiconductor chip to contact pads on a substrate. In flip-chip interconnection, bumps of metal are typically placed on each bond pad. The microelectronic element is then inverted so the metal bumps provide both the electrical pathway between the contacts (e.g., bond pads) of the microelectronic element and the dielectric element as well as the mechanical attachment of the microelectronic element to the dielectric element. There are many variations of the flip-chip process, but one common configuration is to use solder for the bumps of metal and fusion of the solder as the method of fastening it to the bond pads and the substrate. When it melts, the solder may flow to form truncated spheres.

The flip-chip interconnection provides the first microelectronic element 12 with a greater number of (input/output) I/Os in comparison with other microelectronic elements connected to the dielectric element via wire bonds. In addition, the flip-chip interconnection minimizes the wire bond pathway between the second microelectronic element 14 and the dielectric element 30, thereby reducing the impedance of the wire bonds.

In the embodiment depicted in FIG. 2, the flip-chip interconnection 43 may include a plurality of solid metal bumps 45, such as solder balls, disposed between the first microelectronic element 12 and the dielectric element 30. Each solid metal bump 45 may be disposed between (and in contact with) an electrical contact 20 of the first microelectronic element 12 and an electrically conductive element 41 of the dielectric material 30, thereby providing electrical connection between the electrical contact 20 and the electrically conductive element 41. The metal bumps 45 may essentially consist of joining metal or any other suitable material.

An underfill 47 may surround the solid metal bumps 45 to adhere the first microelectronic element 12 to the dielectric material 30. The underfill 47 may be specifically disposed between the front surface 16 of the first microelectronic element 12 and the first surface 34 of the dielectric element 30 to couple the first microelectronic element 12 to the dielectric element 30. Any suitable adhesive may be used for the underfill 47. For example, the underfill 47 may be wholly or partly made of a polymeric adhesive, such as epoxy resin. In some embodiments, however, the underfill 47 is entirely omitted.

Figure 4A:
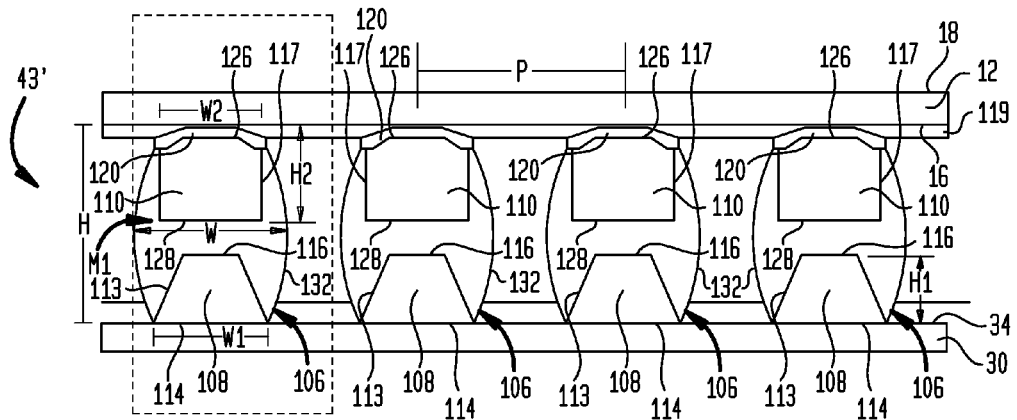
FIG. 4A is a sectional view illustrating a portion of the stacked microelectronic assembly in accordance with a variation of the embodiment shown in FIG. 1.
Figure 4B:
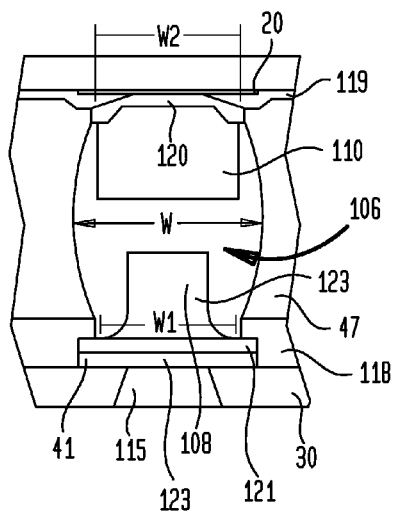
FIG. 4B is a sectional view illustrating a portion of FIG. 4A.

With reference to FIGS. 4A and 4B, in a variation of an embodiment according to the present invention, the flip chip interconnection 43' may include a plurality of substantially rigid conductive columns 106 joining the first microelectronic element 12 and the dielectric element 30, as described in detail in U.S. Patent Application Publication No. 2009/0146303 filed on Sep. 26, 2008, the entire disclosure of which is hereby incorporated herein by reference. The conductive columns 106 include conductive bumps or posts 108 protruding from the first surface 34 of the dielectric element 30 toward the first microelectronic element 12. Each post 108 is substantially aligned with a conductive bump or post 110 protruding from the front surface of the first microelectronic element 12 toward the dielectric element 30. The conductive columns 106 provide for increased height for chip-on-substrate packaging by increasing the standoff or vertical distance between the microelectronic element 12 and dielectric element 30, while at the same time allowing for a decrease in the center-to-center horizontal distance or pitch P between conductive columns 106. The ability to increase the distance between the dielectric element 30 and the microelectronic element 12 may help reduce stress at the conductive columns, may help ease the application of underfill 47, and allow for a greater variety of underfills to be used. In one specific embodiment, the columns 106 extend at least 40% of a separation distance between the front surface 16 of the microelectronic element 12 and the first surface 34 of the dielectric element 30. This 40% separation distance provides may help reduce stress at the conductive columns 106, may help ease the application of underfill 47, and allow for a greater variety of underfills to be used.

The solid metal bumps or conductive posts 108 extend from the first surface 34 of the dielectric element 30 to form the first portion of the conductive columns 106. The conductive posts 108 have top surfaces 116 and edge surfaces 113 extending at substantial angles away from the top surface of the dielectric material 30 such that a distinct angle is created where the edge surfaces 113 meet the first surface 34 of the dielectric element 30. For example, in the embodiment shown, an angle greater than 90 degrees is created between the first surface 34 of the dielectric element 30 and the edge surfaces 113 of the conductive posts 108. The angle will differ based on the shape of the conductive post 108. For example, a cylindrical post may have an angle of 90 degrees between the first surface 34 of the dielectric element 30 and the conductive post 108. Exemplary processes and posts are described in U.S. Patent Application Publication No. 2010/0071944, entitled Chip Capacitor Embedded PWB; U.S. Patent Application Publication No. 2009/0071707, entitled Multilayer Substrate with Interconnection Vias and Method of Manufacturing the Same; U.S. Patent Application Publication No. 2009/0145645 entitled Interconnection Element with Posts Formed by Plating; the entire disclosures all of which are incorporated herein by reference. For example, the conductive posts 108 may be formed by etching processes, as described in more detail herein. Alternatively, conductive posts 108 may be formed by electroplating, in which posts 108 are formed by plating a metal onto a base metal layer through openings patterned in a dielectric layer such as a photoresist layer.

The dimensions of the conductive posts 108 can vary over a significant range, but most typically the height H1 of each conductive post 108 extending from the first surface 34 of dielectric element 30 is at least 50 microns and can extend up to 300 micrometers. These conductive posts 108 may have a height H1 that is greater than its diameter or width W1. However, the height H1 may also be smaller than the width W1, such as at least half the size of the width W1.

The conductive posts 108 may be made from any electrically conductive material, such as copper, copper alloys, gold and combinations thereof. The conductive posts 108 may include at least an exposed metal layer that is wettable by solder. For example, the posts may be comprised of copper with a layer of gold at the surfaces of the posts. Additionally, the conductive posts 108 may include at least one layer of metal having a melting temperature that is greater than a melting temperature of the solder to which it will be joined. For example, such conductive posts 108 would include a layer of copper or be formed entirely of copper.

The conductive posts 108 may also take on many different shapes, including frustoconical. The base 114 and top surfaces 116 of each of the conductive posts 108 may be substantially circular or have a different shape, e.g. oblong. The bases 114 of the conductive posts 108 typically are about 50-300 µm in diameter, whereas the top surfaces 116 typically are about 25-200 µm in diameter. Each conductive post 108 may have a base 114 adjacent the dielectric substrate 30 and a top surface 116 remote from the dielectric element. Additionally, the height H1 of the conductive posts from the first surface 34 of the dielectric element 30 (excluding any solder mask 118) typically ranges from as little as 30 µm up to 200 µm. As shown in FIG. 3B, a solder mask 118 may be disposed over the dielectric element 30 and adjacent the conductive posts 108. The solder mask 118 helps to prevent solder overflow and bridging between adjacent columns 106 during the reflow phase.

As discussed above, the flip-chip interconnection 43' may also include conductive posts 110 extending from the front surface 13 of the first microelectronic element 12. Exemplary conductive posts and methods of making conductive posts capable of extending from a microelectronic element or the like are described in U.S. Pat. Nos. 6,681,982; 6,592,109; and 6,578,754 that are assigned to Advanpak, and the entire disclosures of which are incorporated herein by reference. For example, the conductive posts 110 may be formed by etching processes. Alternatively, conductive posts 110 may be formed by electroplating, in which posts 110 are formed by plating a metal onto a base metal layer through openings patterned in a photoresist layer. Like the conductive posts 108 extending from the dielectric element 30, the posts 110 extending from the microelectronic element 12 may have top surfaces 128 and edge surfaces 117 extending at substantial angles away from the front surface 16 of the microelectronic element such that a distinct angle is created between the microelectronic element and the conductive posts.

To provide a metal contact between the conductive posts 110 and the microelectronic element 12, an underbump metallization layer 120 may be provided on the front surface 16 of the microelectronic element 12. The underbump metallization layer 120 is typically composed of a material including titanium, titanium-tungsten, chromium. The underbump metallization layer 120 operates as the conducting metal contact for the conductive columns 106. A passivation layer 119 may also be provided on the front surface 16 of the microelectronic element 12 between the microelectronic element 12 and the underbump metallization layer 120 using known methods in the art.

The dimensions of the conductive posts 110 extending from the microelectronic element 12 may also vary over a significant range, but most typically the height H2 of each conductive post 110 is not less than 50 microns. The conductive posts 110 may have a height H2 that is greater than its width W2. However, the height may also be smaller than the width W2, such as at least half the size of the width.

The conductive posts 110 can be made from copper or copper alloys, but may also include other electrically conductive materials, such as gold or combinations of gold and copper. Additionally, the conductive posts 110 may include at least one layer of metal having a melting temperature that is greater than a melting temperature of the solder to which it will be joined. For example, such conductive posts would include a layer of copper or be formed entirely of copper.

In a particular embodiment, the conductive posts 110 can be cylindrical, so that the diameter of the bases 126 of the post and top surfaces 128 of the posts are substantially e ual. In one embodiment, the bases 126 and top surfaces 128 of the conductive posts can be about 30-150 µm in diameter. Each conductive post 110 may have a base 126 adjacent the microelectronic element 12 and a top surface 128 remote from the microelectronic element 12. Alternatively, the conductive posts 110 may take on a variety of shapes, such as frustoconical, rectangular, or bar-shaped.

A coating or cap of solder (not shown) may be attached to the top surfaces 128 of the conductive posts 110 or the portion of the conductive posts that are not attached to the microelectronic element 12. The cap of solder may have the same diameter or width W2 of the conductive posts 110 so that it becomes an extension of the conductive post 110. In one example, the cap of solder may have a height H3 ranging from approximately 25-80 µm.

It should be appreciated that the height H2 of the conductive posts 110 extending from the front surface 16 of the microelectronic element 12 may be e ual to the height H1 of the conductive posts 108 extending from the first surface 34 of the dielectric element 30. However, the heights may alternatively differ, such that the height H2 of the conductive posts 110 may be less than or greater than the height H1 of the conductive posts 108. In a particular illustrative example, the conductive posts 110 extending from the microelectronic element 12 may have a height H2 of 50 µm in length, whereas the conductive posts 108 extending from the dielectric element 30 may have a height H1 of 55 µm.

To conductively connect the microelectronic element 12 and dielectric element 30 together, the conductive posts 110 on the microelectronic element 12 must be connected to the conductive posts 108 on the dielectric element 30. The microelectronic element 12 is inverted so that the conductive posts 110 of the microelectronic element 12 and the conductive posts 108 of the dielectric element 30 are aligned with one another and brought into close proximity. The cap of solder on the microelectronic element 12 is reflowed to allow the solder to wet the surfaces of the conductive posts 110 on the microelectronic element 12 and the conductive posts 108 on the dielectric element 30. The solder will wet to the exposed surfaces of the conductive posts and create a conductive column 106 that extends from the microelectronic element 12 to the dielectric element 30. The increased surface areas of the conductive columns 108, 110 on the microelectronic element 12 and dielectric element 30 to which the solder is joined can help reduce the current density at the solder interface. Such decrease in current density may help reduce electromigration and provide for greater durability.

The conductive columns 106 include solder conductively interconnecting the conductive posts. The standoff or height H of the conductive columns extending between the base of the conductive post extending from the microelectronic element and the exposed portions of the base extending from the substrate in one example ranges 80-100 µm.

The walls 132 of the conductive columns 106 can be convex or barrel shaped, wherein the midpoint region M1 of the conductive column (i.e., between the conductive posts 110 of the microelectronic element and conductive posts 108 of the dielectric element 30) has a width W that is greater than the widths W1, W2 of the portions of the conductive columns 106 respectively adjacent the first surface 34 of the dielectric element 30 and front surface 16 of the microelectronic element 12.

As further shown in FIG. 4A, the lower post 108 that extends away from the dielectric element 30, as well as the lower contact pad 117 may be formed by separate etching steps, such as disclosed in International Application PCT No. WO 2008/076428, which published on Jun. 28, 2008 and the entire disclosure of which is incorporated herein by reference. For example, a tri-metal substrate with top and bottom metal layers 123 and in intermediate etch stop layer or interior metal layer 121 may be utilized to create the conductive post 108 and contact pad 41. In one such process, an exposed metal layer of a three-layer or more layered metal structure is etched in accordance with a photolithographically patterned photoresist layer to form the conductive post 108, the etching process stopping on an interior metal layer 121 of the structure. The interior metal layer 121 includes one or more metals different from that of the top and bottom metal layers 123, the interior metal layer being of such composition that it is not attached by the etchant used to etch the top metal layer 123. For example, the top metal layer 123 from which the conductive posts 108 are etched consists essentially of copper, the bottom metal layer 123 may also consist essentially of copper, and the interior metal layer 121 consists essentially of nickel. Nickel provides good selectivity relative to copper to avoid the nickel layer from being attached with the metal layer is etched to form conductive posts 108. To form the contact pad 41, another etching step may be conducted in accordance with another photolithographically patterned photoresist layer. The post 108 may be further interconnected with other conductive features such as a via 115, which is, in turn, further interconnected to other conductive features (not shown).

The microelectronic assembly 10 may alternatively include other kinds of flip-chip interconnections. Other types of flip-chip interconnections are described in U.S. Patent Application Publication No. 2009/0146303 filed on Sep. 26, 2008; and U.S. patent application Ser. No. 12/832,376 filed Jul. 8, 2010 and entitled "Microelectronic Packages with Dual or Multiple-etched Flip Connectors," the entire disclosures of all of which are incorporated herein by reference.

Figure 5:
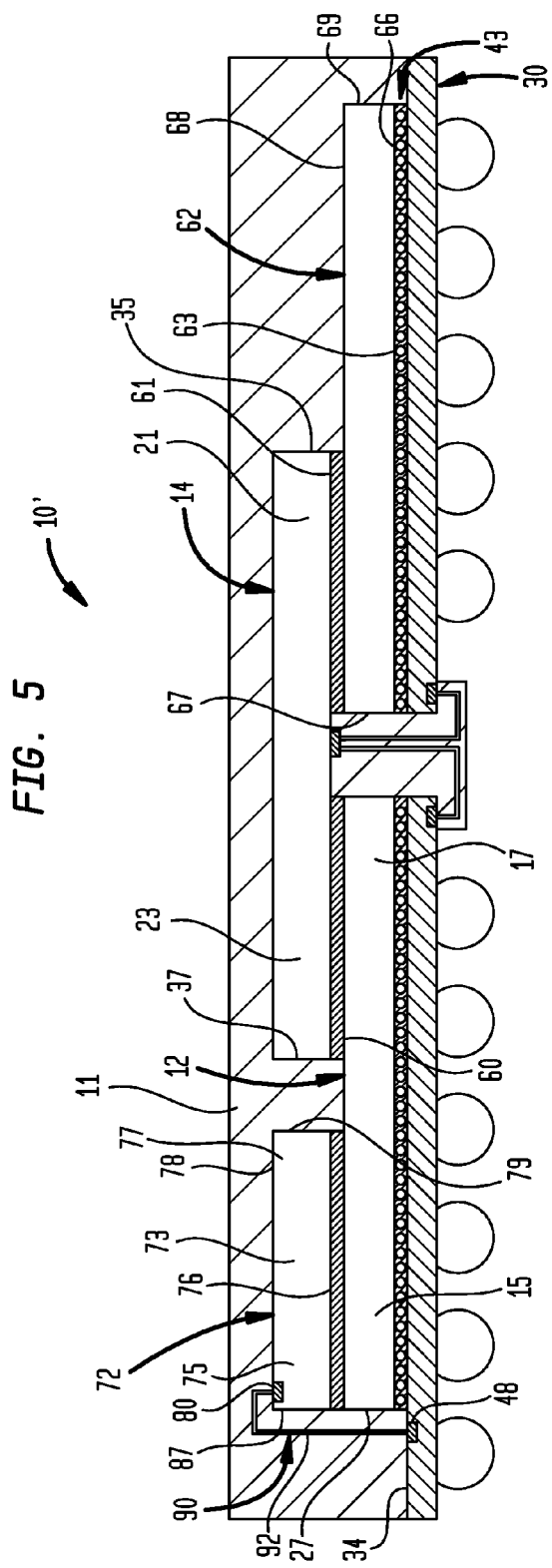
FIG. 5 is a diagrammatic sectional elevation view of a stacked microelectronic assembly according to an embodiment of the present invention.
Figure 6:
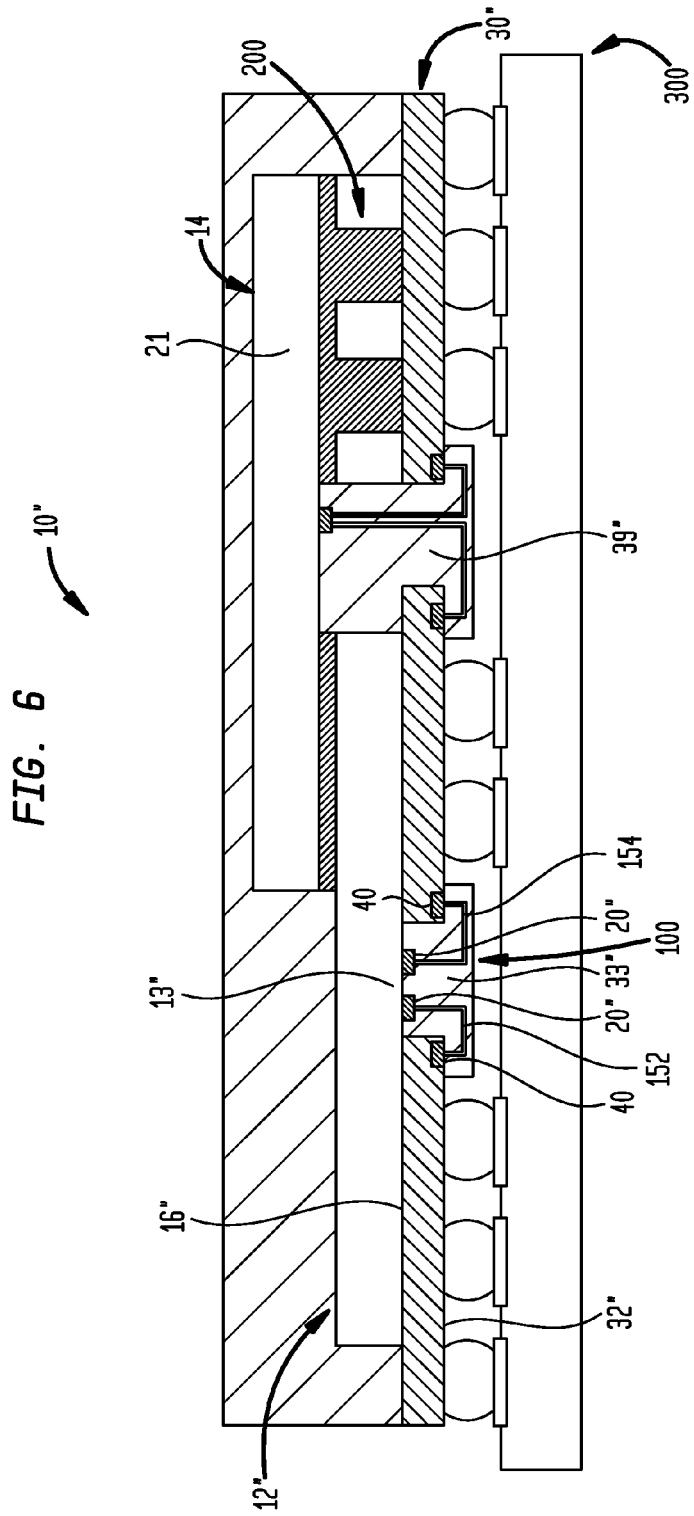
FIG. 6 is a diagrammatic sectional elevation view of a stacked microelectronic assembly in accordance with another embodiment of the present invention.

FIG. 5 depicts a variation of the microelectronic assembly 10 shown in FIG. 1. The microelectronic assembly 10' shown in FIG. 5 is similar to the microelectronic assembly 10 shown in FIG. 1. In this variation, in lieu of the spacing element 31 depicted in FIG. 1, a third microelectronic element 62 is disposed between the first end region 21 of the second microelectronic element 14 and a portion of the dielectric element 30. The third microelectronic element 62 extends beyond the second edge 35 of the second microelectronic element 14 and may be a chip having a logic function, such as a microprocessor, or a memory chip, such as a flash (NOR or NAND) memory chip, DRAM or SRAM array. Moreover, the third microelectronic element 62 has a front surface 66, a rear surface 68 remote therefrom, and first and second edges 67, 69, extending between the front and rear surfaces. Electrical contacts 63 are exposed at the front surface 66 of the third microelectronic element 62. Any of the flip-chip interconnections described above, such as interconnection 43, electrically connects electrical contacts 63 on the front surface 66 of the third microelectronic element 62 to the electrically conductive elements 41 on the first surface 34 of the dielectric element 30.

A bond material 61 such as the bond material described above (FIG. 1) may be disposed between the second microelectronic element 14 and rear surface 68 of the third microelectronic element 62.

The microelectronic assembly 10' may alternatively or additionally include another microelectronic element 72 in a face up position and disposed on top of the first microelectronic element 12. This microelectronic element 72 may be a chip which is configured predominantly to perform a logic function, such as a microprocessor, co-processor, graphics processor or signal processor, application-specific integrated circuit chip ("ASIC") or field programmable gate ("FPGA") chip, among other examples. Alternatively, this microelectronic element 72 can be a memory chip, such as a flash (NOR or NAND) memory array, DRAM or SRAM array, among many possible types. Microelectronic element 72 has a rear surface 76, a front surface 78 remote therefrom, and first and second edges 87 and 79 extending between the front and rear surfaces. The front surface 78 of the fourth microelectronic element 72 may include first and second end regions 75 and 77 and a central region 73 located between the first and second end regions 75 and 77. The first end region 75 extends between the central region 73 and first edge 87, and the second end region 77 extends between the central region 73 and the second edge 79. Electrical contacts 80, such as bond pads, are exposed at the front surface 78 of microelectronic element 72. The electrical contacts 80 may be disposed within the first end region 75, second end region 77 and/or the central region 73 of the front surface 78. In the embodiment shown, the electrical contacts 80 are disposed within the first end region 75 of the front surface 78. The first edge 87 of the microelectronic element 72 may be aligned with the first edge 27 of the first microelectronic element 12.

The front surface of first microelectronic element 14 can be attached to the rear surface of second microelectronic element 12 by an adhesive 60. The rear surface of microelectronic element 72 can also be attached to rear surface of microelectronic element 12 by the adhesive. An adhesive layer and is positioned between the second end region 23 of the second microelectronic element 14 and the second end region 17 of the first microelectronic element 12 and between the first end region 15 of the first microelectronic element 12 and the fourth microelectronic element 72. Thus, the spacing element 60 extends beyond the first edge 37 of the second microelectronic element 14 and may terminate at the first edge 87 of the fourth microelectronic element 72. If spacing element 60 includes an adhesive, the adhesive can connect the first microelectronic element 12 to the fourth microelectronic element 72.

One or more electrical connections or leads 90 electrically connect contacts 80 on the rear surface 78 of the fourth microelectronic element 72 to some electrically conductive elements 41 on first surface 34 of the dielectric element 30. Electrical connections 90 may include one or more wire bonds 92 electrically connecting some contacts of fourth microelectronic element 72 with conductive elements 41 on the first surface 34 of the dielectric element 30. Alternatively or additionally, the electrical connections 90 may include lead bonds. Wire bonds 92 can extend around the first edge 87 of the fourth microelectronic element 72 and the second edge 27 of the first microelectronic element 12. Each of the wire bonds 92 electrically connects a contact 80 to a corresponding conductive element 48 exposed at the first surface 34 of the dielectric element 30. Electrical connections 90 may include a multiple wire bond structure as described in U.S. patent application Ser. No. 12/907,522 filed Oct. 19, 2010 and entitled "Enhanced Stacked Microelectronic Assemblies with Central Contacts and Improved Thermal Characteristics," the entire disclosure of which is incorporated herein by reference.

The microelectronic assembly 10' or any other microelectronic assembly described herein may be connected to a circuit panel 300, such as a circuit printed board, via joining units 81, as shown in FIG. 5.

The microelectronic assembly 10" may further include one or more power regulation components and/or microelectromechanical systems (MEMS) 200 disposed between the first end region 21 of the second microelectronic element 14 and a portion of the dielectric element 30", which may additionally serve to space the front surface of microelectronic element 14 a desired distance above the surface 34" of the substrate. The power regulation components have active circuit elements and can increase performance of the microelectronic assembly 10", especially in power-sensitive applications such as mobile devices, and may be one or more on/off switches, such as a transistor, or other components suitable to regulate power stemming from a power source. For instance, in some embodiments, the power regulation components 200 may be a power management integrated circuit chip or a microcontroller capable of controlling the supply of power to the first or second microelectronic elements 12" and 14. The power regulation components 200 may, for example, constantly allow power supply to the first microelectronic element 12" but only turn on the second microelectronic element 14" when a high-power application is being use. In such embodiment, power may be supplied only to the first microelectronic element 12" when a low-power application is in use.

The spacing element 31 of the microelectronic assembly 10 shown in FIG. 1 may be substituted by one or more power regulation components and/or MEMS 200. Similarly, a third microelectronic element 62 of the microelectronic assembly 10 shown in FIG. 4 may be replaced by one or more power regulation components and/or MEMS 200. The MEMS 200 may include one or more pressure sensors and/or acceleration sensors.

Figure 7:
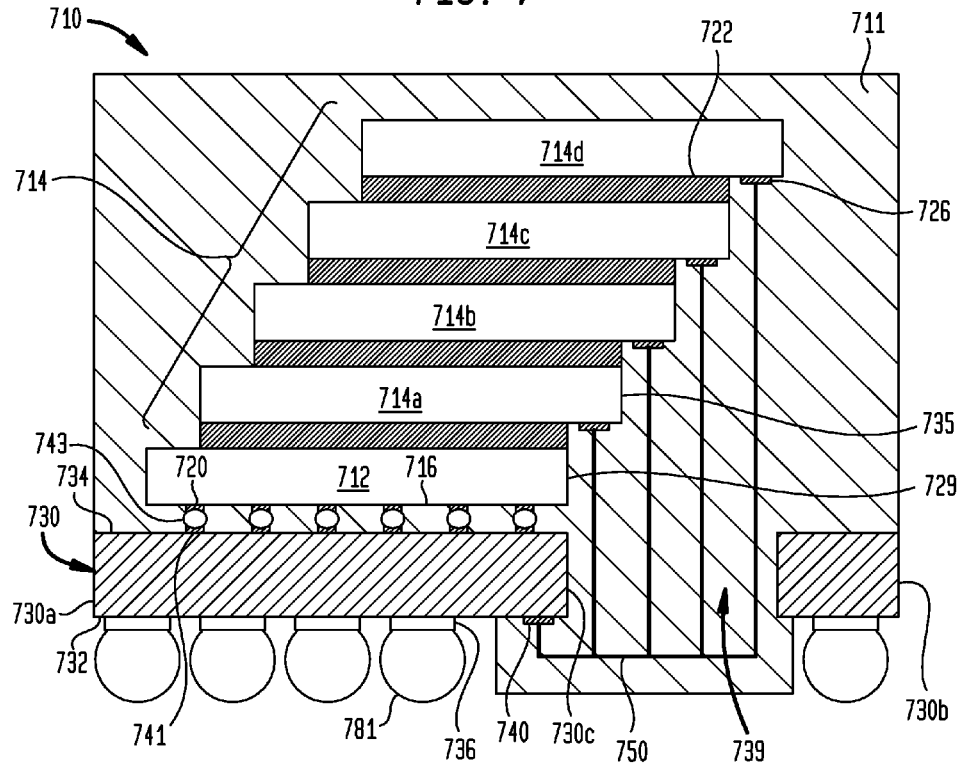
FIG. 7 is a diagrammatic sectional elevation view of a stacked microelectronic assembly in accordance with another embodiment of the present invention.

FIG. 7 illustrates a variation of the microelectronic assembly 10 of FIG. 1 having an alternate configuration. The microelectronic assembly 710 shown in FIG. 7 is the same as the microelectronic assembly 10 described above, except that the microelectronic assembly 710 includes a stack of second microelectronic elements 714 overlying the first microelectronic element 712.

Similar to the embodiment shown in FIG. 1, the first microelectronic element 712 can be flip-chip bonded to the dielectric element 730 with a flip-chip interconnection 743 that electrically connects electrical contacts 720 on the front surface 716 of the first microelectronic element 712 to the electrically conductive elements 741 on the first surface 734 of the dielectric element.

In the example shown, a first edge 735 of a second microelectronic element 714a can extend beyond a second edge 729 of the first microelectronic element 712, such that one or more electrically conductive contacts 726 exposed at the front surface 722 of the second microelectronic element 714a is disposed beyond the second edge 729 of the first microelectronic element. Likewise, the first edge 735 of each of the second microelectronic elements 714b, 714c, and 714d can extend beyond the first edge of the second microelectronic element disposed adjacent the front surface thereof, such that one or more electrically conductive contacts 726 exposed at the front surface 722 of each of the second microelectronic elements 714b, 714c, and 714d is disposed beyond the first edge of the second microelectronic element disposed adjacent the front surface thereof.

A plurality of leads can electrically connect the contacts 726 of each second microelectronic element with the terminals 736 of the microelectronic assembly 710. The leads can have portions aligned with at least one aperture 739 extending through the dielectric element 730. For example, the leads can include wire bonds 750 extending between the contacts 726 of each second microelectronic element 714 to electrically conductive contacts 740 exposed at the second surface 732 of the dielectric element 730, which in turn can connect to terminals 736 through other portions of the leads such as metal traces extending along the dielectric element 730.

Although the microelectronic assembly 710 is shown in FIG. 7 having at least one aperture 739 extending through the dielectric element 730, in an alternative example, a dielectric element can be provided without an aperture 739. In such an embodiment, the dielectric element 730 can include a single region 730a, and the region 730b can be omitted. In this example, the portions of the leads extending between the contacts 726 of the second microelectronic elements 714 and the contacts 740 of the dielectric element 730 (e.g., the wire bonds 750) can extend around an edge 730c of the dielectric element that can be a peripheral edge of the dielectric element if the region 730b is omitted.

The microelectronic assembly 710 can include joining units 781 (e.g., solder balls) attached to the terminals 736 exposed at the second surface 732 of the dielectric element 730. Such joining units 781 can be adapted to join and electrically couple the microelectronic assembly 710 to an external component, for example, a circuit panel such as a printed circuit board.

In an exemplary embodiment, the microelectronic assembly 710 can be configured to function as a solid state memory drive. In such an example, the first microelectronic element 712 can include a semiconductor chip configured predominantly to perform a logic function, such as a solid state drive controller, and the second microelectronic elements 714 can each include memory storage elements such as nonvolatile flash memory. The first microelectronic element 712 can include a special purpose processor that is configured to relieve a central processing unit of a system such as the system 1100 (FIG. 8) from supervision of transfers of data to and from the memory storage elements included in the second microelectronic elements 714. Such a first microelectronic element 712 including a solid state drive controller can provide direct memory access to and from a data bus on a motherboard (e.g., the circuit panel 1102 shown in FIG. 8) of a system such as the system 1100.

In a particular embodiment, the first microelectronic element 712 can have a buffering function. Such a first microelectronic element 712 can be configured to help provide impedance isolation for each of the second microelectronic elements 714 with respect to components external to the microelectronic assembly 710.

Figure 8:
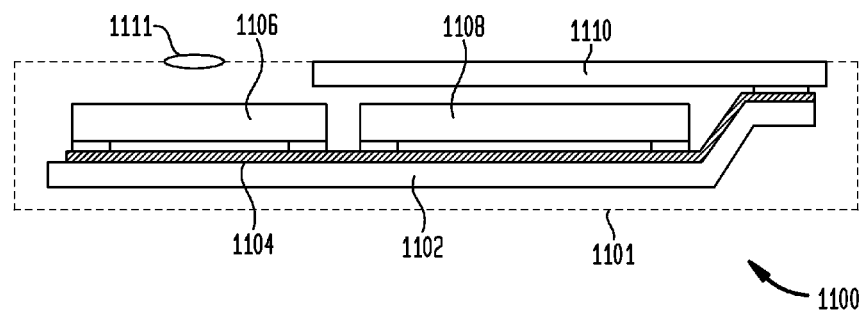
FIG. 8 is a schematic depiction of a system according to one embodiment of the invention.

The microelectronic assemblies described above can be utilized in construction of diverse electronic systems, as shown in FIG. 8. For example, a system 1100 in accordance with a further embodiment of the invention includes a microelectronic assembly 1106 as described above in conjunction with other electronic components 1108 and 1110. In the example depicted, the component 1108 is a semiconductor chip whereas component 1110 is a display screen, but any other components can be used. Of course, although only two additional components are depicted in FIG. 8 for clarity of illustration, the system may include any number of such components. The microelectronic assembly 1106 may be any of the assemblies described above. In a further variant, any number of such microelectronic assemblies may be used. The microelectronic assembly 1106 and the components 1108 and 1110 are mounted in a common housing 1101, schematically depicted in broken lines, and are electrically interconnected with one another as necessary to form the desired circuit. In the exemplary system shown, the system includes a circuit panel 1102 such as a flexible printed circuit board, and the circuit panel includes numerous conductors 1104, of which only one is depicted in FIG. 8, interconnecting the components with one another. However, this is merely exemplary; any suitable structure for making electrical connections can be used. The housing 1101 is depicted as a portable housing of the type usable, for example, in a cellular telephone or personal digital assistant, and screen 1110 is exposed at the surface of the housing. Where structure 1106 includes a light-sensitive element such as an imaging chip, a lens 1111 or other optical device also may be provided for routing light to the structure. Again, the simplified system shown in FIG. 8 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
a substrate having oppositely-facing first and second surfaces, the substrate having substrate contacts at the first surface and terminals at the second surface;
a first microelectronic element having a front surface facing the first surface, a rear surface remote therefrom, and an edge extending between the front and rear surfaces, the first microelectronic element having a plurality of contacts at the front surface that face and are joined to corresponding ones of the substrate contacts;
a second microelectronic element having a front surface facing the first microelectronic element, the second microelectronic element having a plurality of contacts exposed at the front surface thereof beyond the edge of the first microelectronic element, the second microelectronic element embodying a greater number of active devices to provide memory storage array function than any other function; and
leads electrically connecting the contacts of the second microelectronic element with the terminals,
wherein the first microelectronic element is configured to regenerate at least some signals received by the microelectronic assembly at the terminals and to transmit said signals to the second microelectronic element.

2. The microelectronic assembly as claimed in claim 1, wherein at least one row of the contacts of the first microelectronic element extend in a first direction and at least one row of the contacts of the second microelectronic element extend in a second direction transverse to the first direction, the substrate has at least one aperture extending between the first and second surfaces and in the second direction, and the leads have portions aligned with the at least one aperture.

3. The microelectronic assembly as claimed in claim 1, wherein the first microelectronic element is configured to control transfers of data between a component external to the microelectronic assembly and the second microelectronic element.

4. The microelectronic assembly as claimed in claim 3, wherein the first microelectronic element is configured to provide buffering of signals between the external component and the second microelectronic element.

5. The microelectronic assembly as claimed in claim 1, wherein the first microelectronic element is configured to predominantly perform a logic function.

6. The microelectronic assembly as claimed in claim 1, wherein the contacts of the second microelectronic element are disposed within a central region of the front surface thereof, the central region spaced apart from first and second opposed edges of the second microelectronic element.

7. The microelectronic assembly as claimed in claim 1, wherein the leads include wire bonds extending through the at least one aperture to bonding contacts at the second surface of the substrate.

8. The microelectronic assembly as claimed in claim 1, further comprising substantially rigid electrically conductive posts extending from at least one of the substrate or the first microelectronic element, the substantially rigid electrically conductive posts electrically connecting the first microelectronic element with the substrate.

9. The microelectronic assembly as claimed in claim 1, further comprising a spacing element between the front surface of the second microelectronic element and the first surface of the substrate.

10. A system comprising a microelectronic assembly according to claim 1 and one or more other electronic components electrically connected to the microelectronic assembly.

11. The system as claimed in claim 10, further comprising a housing, the microelectronic assembly and the other electronic components being mounted to the housing.

12. A microelectronic assembly, comprising:
- a substrate having oppositely-facing first and second surfaces, the substrate having substrate contacts at the first surface and terminals at the second surface;
- a first microelectronic element having a front surface facing the first surface, a rear surface remote therefrom, and an edge extending between the front and rear surfaces, the first microelectronic element having a plurality of contacts at the front surface that face and are joined to corresponding ones of the substrate contacts;
- a second microelectronic element having a front surface facing the first microelectronic element, the second microelectronic element having a plurality of contacts exposed at the front surface thereof beyond the edge of the first microelectronic element, the second microelectronic element embodying a greater number of active devices to provide memory storage array function than any other function;
- leads electrically connecting the contacts of the second microelectronic element with the terminals; and
- at least one power regulation component having active circuit elements therein disposed between the first surface of the substrate and the front surface of the second microelectronic element.

13. The microelectronic assembly as claimed in claim 12, wherein at least one row of the contacts of the first microelectronic element extend in a first direction and at least one row of the contacts of the second microelectronic element extend in a second direction transverse to the first direction, the substrate has at least one aperture extending between the first and second surfaces and in the second direction, and the leads have portions aligned with the at least one aperture.

14. The microelectronic assembly as claimed in claim 12, wherein the first microelectronic element is configured to predominantly perform a logic function.

15. The microelectronic assembly as claimed in claim 12, wherein the contacts of the second microelectronic element are disposed within a central region of the front surface thereof, the central region spaced apart from first and second opposed edges of the second microelectronic element.

16. The microelectronic assembly as claimed in claim 12, wherein the leads include wire bonds extending through the at least one aperture to bonding contacts at the second surface of the substrate.

17. The microelectronic assembly as claimed in claim 12, further comprising substantially rigid electrically conductive posts extending from at least one of the substrate or the first microelectronic element, the substantially rigid electrically conductive posts electrically connecting the first microelectronic element with the substrate.

18. A system comprising a microelectronic assembly according to claim 12 and one or more other electronic components electrically connected to the microelectronic assembly.

19. The system as claimed in claim 18, further comprising a housing, the microelectronic assembly and the other electronic components being mounted to the housing.

* * * * *